United States Patent

Matsuo et al.

[11] Patent Number: 5,994,227
[45] Date of Patent: Nov. 30, 1999

[54] METHOD OF MANUFACTURING SEMICONDUCTOR DEVICE

[75] Inventors: Hiroshi Matsuo; Takuji Oda; Yuichi Yokoyama; Kiyoshi Maeda; Shinya Inoue; Yuji Yamamoto, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 09/119,045

[22] Filed: Jul. 20, 1998

[30] Foreign Application Priority Data

Dec. 24, 1997 [JP] Japan .................................... 9-355353

[51] Int. Cl.$^6$ ..................................................... H01L 21/00

[52] U.S. Cl. ........................... 438/696; 438/743; 438/744; 216/74

[58] Field of Search ....................... 216/67, 79; 438/696, 438/723, 724, 734, 740, 743, 744

[56] References Cited

U.S. PATENT DOCUMENTS

| | | | |
|---|---|---|---|
| 5,286,344 | 2/1994 | Blalock et al. | 156/657 |
| 5,462,896 | 10/1995 | Komura et al. | 437/228 |
| 5,726,100 | 3/1998 | Givens | 438/702 |

FOREIGN PATENT DOCUMENTS

| | | |
|---|---|---|
| 6-12765 | 2/1994 | Japan . |
| 7-161702 | 6/1995 | Japan . |
| 8-97186 | 4/1996 | Japan . |

*Primary Examiner*—Bruce Breneman
*Assistant Examiner*—Alva C. Powell
*Attorney, Agent, or Firm*—McDermott, Will & Emery

[57] ABSTRACT

An improved etching method allowing the formation of a silicon nitride film with an adequate film thickness at the sidewall portion of a pattern is disclosed. A silicon nitride film formed to cover a stepped pattern is dry-etched, employing plasma of mixed gases containing $CH_2F_2$ and $O_2$. As a result, a sidewall spacer of the silicon nitride film is formed at the sidewall of the pattern in a self-aligned manner.

10 Claims, 5 Drawing Sheets

METHOD OF MANUFACTURING SEMICONDUCTOR DEVICE

BACKGROUND OF THE INVENTION

Field of the Invention

The present invention generally relates to a method of etching, and more particularly to an etching method using a silicon nitride stopper for forming a self aligned direct contact to be used in a memory cell such as RAM (Random Access Memory) and SRAM (Static Random Access Memory).

Conventional methods of selectively etching a silicon nitride film include wet etching using hot phosphoric acid, and dry etching using $CH_2F_2$ or $CH_3F$ as disclosed in Japanese Patent Publication No. 6-12765.

However, in a memory cell portion in which a self aligned direct contact is to be formed using a silicon nitride stopper, if the silicon nitride film provided as the stopper layer is removed by wet etching, which will proceed isotropically, a problem will arise that the silicon nitride film cannot be left on the sidewall portion of a pattern as desired.

Further, if a parallel-plate type reactive ion etching system (RIE) is employed with conventionally known reactive gases such as $CF_4$ and $CHF_3$, each rate will become higher at the sidewall portion of a pattern than at the bottom of the hole due to sputtering effect, and thus it is difficult to form a sidewall of the silicon nitride film with a necessary height. Moreover, if the above-mentioned dry etching method as disclosed in Japanese Patent Publication No. 6-12765 is employed, as the etch selectivity of a silicon oxide film to a silicon nitride film is 10 or higher, etching will stop at the silicon oxide film located beneath the silicon nitride film, and thus an electrical contact fails.

SUMMARY OF THE INVENTION

The present invention is directed to solve the problems described above. An object of the invention is therefore to provide an improved etching method permitting the formation of a silicon nitride film with an adequate film thickness at the sidewall portion of a pattern.

A first aspect of the present invention relates to an etching method of forming a sidewall spacer of a silicon nitride film at the sidewall of a stepped pattern in a self-alignment manner. The silicon nitride film formed to cover the pattern is dry-etched employing mixed gas plasma containing $CH_2F_2$ and $O_2$.

In this dry etching, the etch selectivity can easily be altered depending on the partial pressure of oxygen, since the mixed gas plasma including $CH_2F_2$ and $O_2$ is employed.

According to a second aspect of the present invention, the silicon nitride film is formed to cover the pattern with an oxide film therebetween.

Consequently, the silicon nitride film can be left at the sidewall with much more thickness, while generation of hot carriers is restricted.

According to a third aspect of the present invention, the etching is conducted by setting the mixture ratio of $O_2$ to $CH_2F_2$ between 25 and 40%.

As a result, the etch selectivity of a silicon oxide film to a silicon nitride film can be made within the range from 2 to 3.

According to a fourth aspect of the present invention, after the etching of the silicon nitride film, the oxide film is etched by setting the etch selectivity of the oxide film to the silicon nitride film to 1 or lower.

As a result, a higher sidewall of the silicon nitride film can be formed.

According to a fifth aspect of the present invention, the silicon nitride film is etched employing an etching mask having an opening with an opening diameter of 0.1 to 0.5 μm, making an etching condition such that the etch rate of the silicon nitride film becomes faster as the opening area becomes smaller.

As the etching of a silicon nitride film for forming a self aligned direct contact is performed under this condition, the etch rate at the bottom of the hole increases, while the rate becomes controllable at the silicon nitride sidewall portion having a hole diameter made large.

According to a sixth aspect of the present invention, the etching described above is performed when forming a direct contact on a memory cell structure.

The resulting memory cell is provided with a silicon nitride film having a sufficient film thickness at the sidewall portion of a pattern.

According to a seventh aspect of the present invention, the etching is conducted using a parallel-plate type etching system.

Thus the present invention can be implemented in a general-purpose etching system.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

The first embodiment of the invention relates to a method of manufacturing a self aligned direct contact using a silicon nitride stopper.

Figure 1:
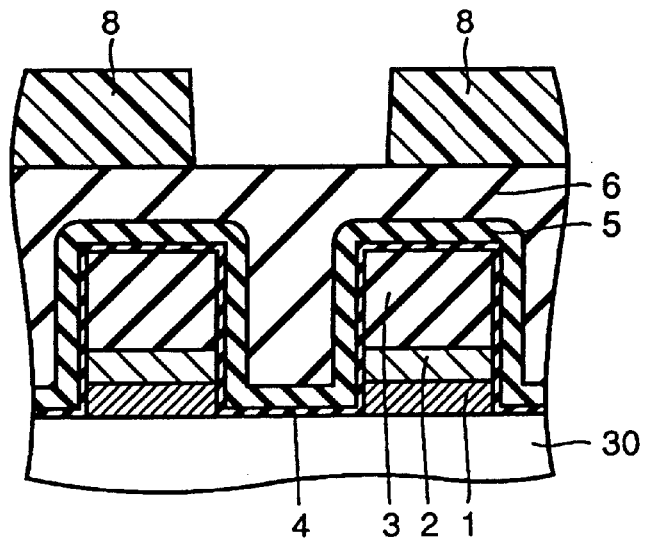
FIGS. 1 to 4 are sectional views of a semiconductor device at the first to fourth steps of the method of manufacturing a semiconductor device according to a first embodiment of the present invention.

Referring to FIG. 1, a gate interconnection 1 (of doped amorphous silicon) and a gate interconnection 2 (of WSi) are formed on a semiconductor substrate 30, with a gate oxide film (not shown) interposed between the substrate and gate interconnection 1. Gate interconnections 1 and 2 are obtained by etching the amorphous silicon film and the tungsten silicide film, respectively, using an oxide hard mask 3. An underlying TEOS film 4 as countermeasures against hot carriers is formed on semiconductor substrate 30 to cover gate interconnections 1 and 2. A silicon nitride film stopper layer 5 is then formed to cover gate interconnections 1 and 2. On semiconductor substrate 30, an interlayer insulating film 6 (SiO$_2$) is formed and planarized. Thereafter, on interlayer insulating film 6, a resist mask 8 is formed by photolithography.

Figure 2:
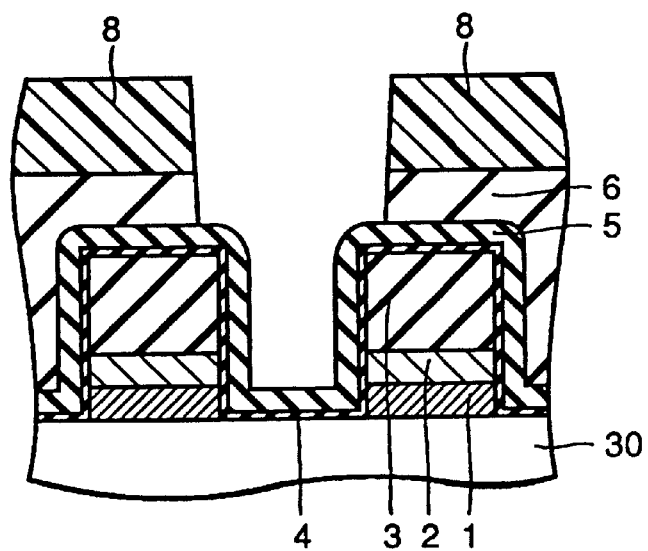

Referring to FIGS. 1 and 2, interlayer insulating film 6 is etched using resist mask 8, down to the surface of silicon nitride stopper layer 5. Resist mask 8 is then removed.

Figure 3:
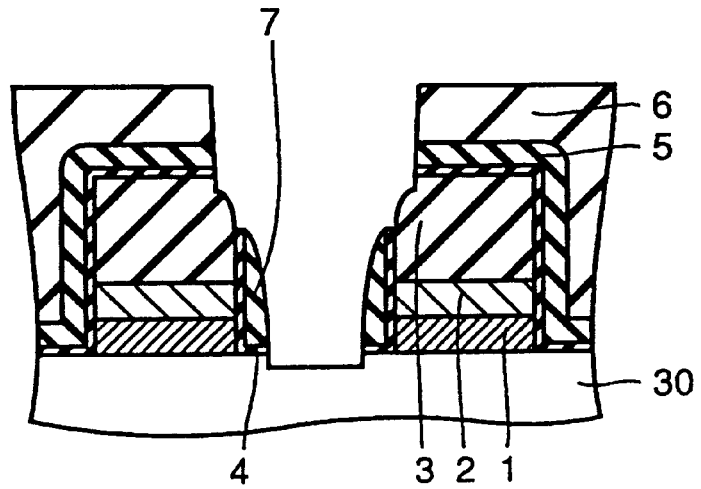

Referring to FIGS. 2 and 3, a silicon nitride film provided as a stopper layer 5, is subjected to etching to open a hole, for a time period enough to completely remove any etch residues of the silicon nitride film from the bottom of the contact hole. FIG. 3 shows a slightly over-etched state.

Figure 4:
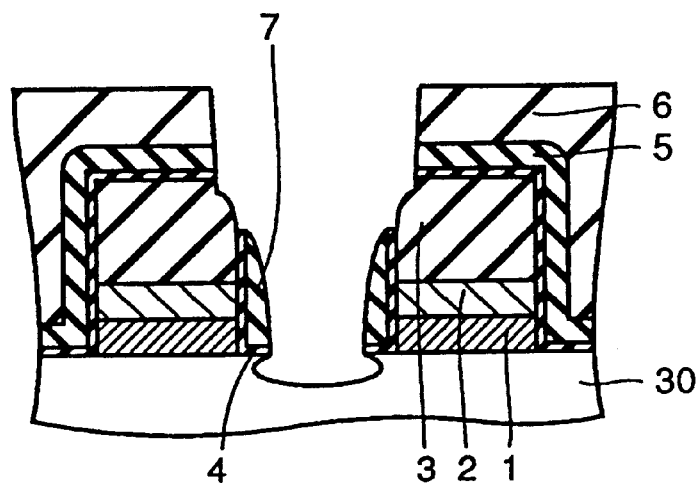

Referring to FIGS. 3 and 4, the affected layer of silicon as a result of the etching of the silicon nitride film is removed by dry etching with reactive gases mainly containing fluorocarbon gases. At this time, there is a need to leave a silicon nitride sidewall 7 at the sidewall portions of gate interconnections 1 and 2 in order to electrically isolate gate interconnections 1, 2 from a bit line to be formed subsequently. Although not shown, the bit line is then filled in the hole, whereby the formation of a memory cell completes.

Figure 5:
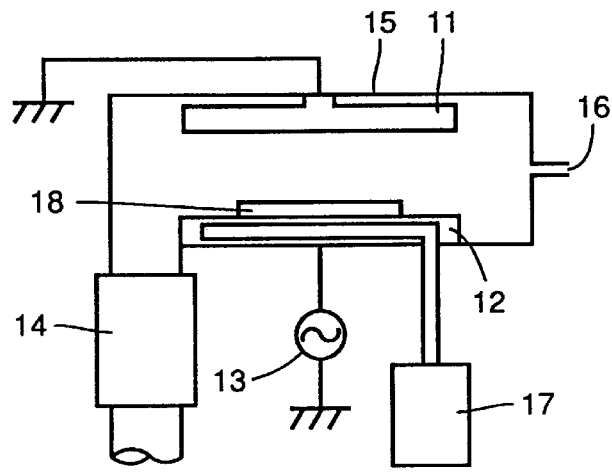
FIG. 5 is a schematic diagram of a typical etching system used with the method according to the first embodiment of the invention.

FIG. 5 is a schematic view of an etching system employed to form a silicon nitride film sidewall. Normally a device referred to as of a parallel-plate type is used.

A pair of electrodes 11, 12 is provided, opposing to each other, in a chamber 15. A high-frequency power supply 13 is connected to electrode 12, on which a wafer 18 is placed. Chamber 15 is evacuated by a turbo molecular pump 14 to the order of $10^{-5}$ Torr. When etching, mixed gases containing CH$_2$F$_2$ and O$_2$ are introduced through a gas inlet 16 into chamber 15. Keeping the interior of chamber 15 at some hundreds mTorr, plasma is then generated by applying power from high-frequency power supply 13 to etch the surface of wafer 18. Note that the temperature of wafer 18 is controlled during etching by cooling it using a cooler 17.

Figure 6:
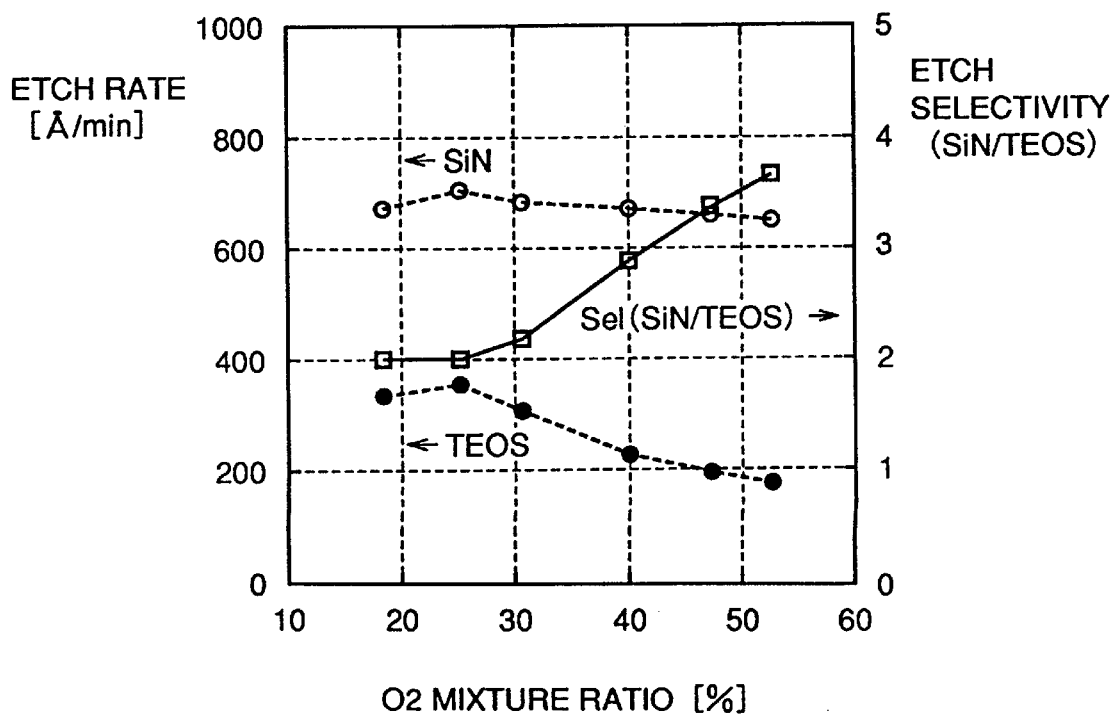
FIG. 6 is a graph showing a relation between the etch rates of a silicon nitride film and a TEOS film, and the mixture ratio of $O_2$ in the $CH_2F_2+O_2$ gases.

FIG. 6 shows relations of the O$_2$ mixture ratio to the etch rates of a silicon nitride film and a silicon oxide film, and to their etch selectivity, obtained by way of example where the high-frequency power of 200 W is provided and the mixture ratio of CH$_2$F$_2$ and O$_2$ is altered as diluted with Ar.

As seen from FIG. 6, as the O$_2$ mixture ratio becomes higher, the etch selectivity of the silicon nitride film to the silicon oxide film will increase. However, in the region where the etch selectivity exceeds 3, i.e., where the O$_2$ mixture ratio is 40% or higher, fluorine radical becomes excessive in the etching atmosphere and results in isotropic etching. In the region with the oxygen mixture ratio of 25% or lower where the etch selectivity falls lower than 2, a protective film containing carbon and fluorine is formed excessively, which causes etching to stop, and results in failure in opening.

Therefore, etching is preferably conducted in a region with a certain partial pressure of oxygen which ensures the etch selectivity in the range of 2 to 3. It has been confirmed that a sidewall with an adequate thickness can be formed of a silicon nitride film if the silicon nitride film is etched under this condition to form a self aligned direct contact using the silicon nitride film as a stopper.

Further under this condition, with a resist mask having an opening diameter in the range of around 0.1 to 0.5 μm, etch rate increases as the contact hole advances downward, i.e., as the opening diameter becomes smaller. Therefore, when the etching of a silicon nitride film for forming a self aligned direct contact is carried out under this condition, etch rate at the bottom of the hole becomes higher, while the rate can be controlled at the silicon nitride sidewall portion with a hole diameter made large. As a result, it has been confirmed that advantageous effects are obtained on the formation of the silicon nitride sidewall.

Second Embodiment

The first embodiment of the invention exemplified and described a case in which the silicon nitride film and the TEOS film thereunder were to be removed by the same etching condition. When etching the underlying TEOS film under the same condition as the silicon nitride film, however, due to the etch selectivity of the silicon nitride film to the silicon oxide film being 2 to 3, the silicon nitride film will be etched by two or three times the film thickness of the underlying TEOS film during the etching of the TEOS film. Therefore, when the silicon nitride sidewall needs to be left higher, it should be desirable to conduct etching in two steps as described below.

Firstly, the silicon nitride film is subjected to etching under the condition as described with the first embodiment, where a proper amount of over-etching is set to ensure that no etch residue from the silicon nitride film is left on the underlying TEOS film.

Next, the underlying TEOS film is to be etched to form a hole, under the condition that the etch rate of the silicon oxide film and the silicon nitride film are made substantially equal, or the etch selectivity of the silicon oxide film to the silicon nitride film is made 1 or lower, by, for example, using as reactive gas the mixture of fluorocarbon gas and Ar. When etching is carried out in these two steps, the resultant silicon nitride sidewall can be made by more than twice the film thickness of the underlying TEOS film higher than that obtained when the two films are simultaneously etched under the same condition. As a result, a larger insulation margin is guaranteed.

Third Embodiment

In the first and second embodiments of the invention, etching for forming a self aligned direct contact in a structure where the gate electrode has no sidewall spacer was described. However, the present invention is not limited thereto.

Figure 7:
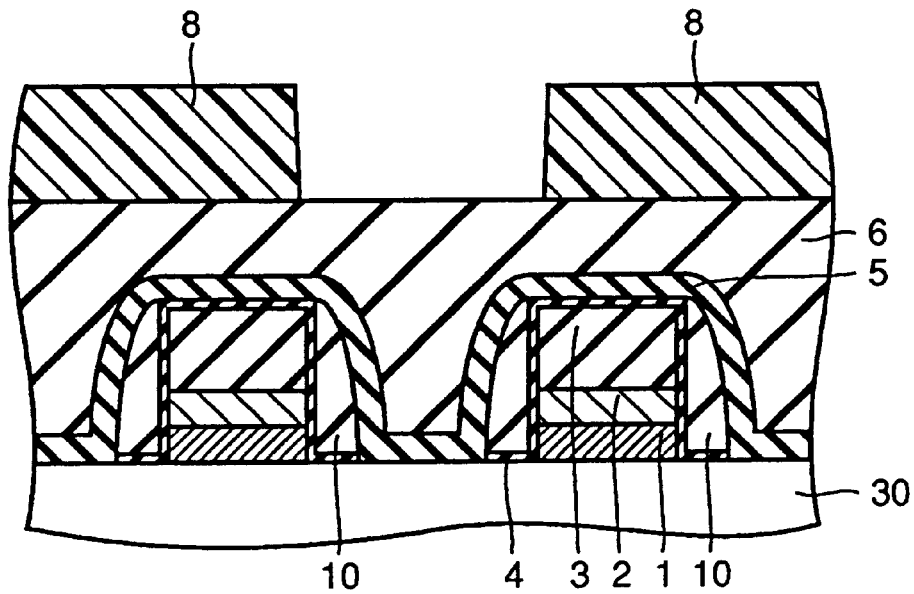
FIGS. 7 to 9 are sectional views of a semiconductor device at the first to third steps of the method of manufacturing a semiconductor device according to a third embodiment of the present invention.

Referring to FIG. 7, the invention is also applicable to a structure where silicon oxide sidewalls 10 are provided at opposing sides of gate electrodes 1, 2, yielding the similar effects.

Figure 8:
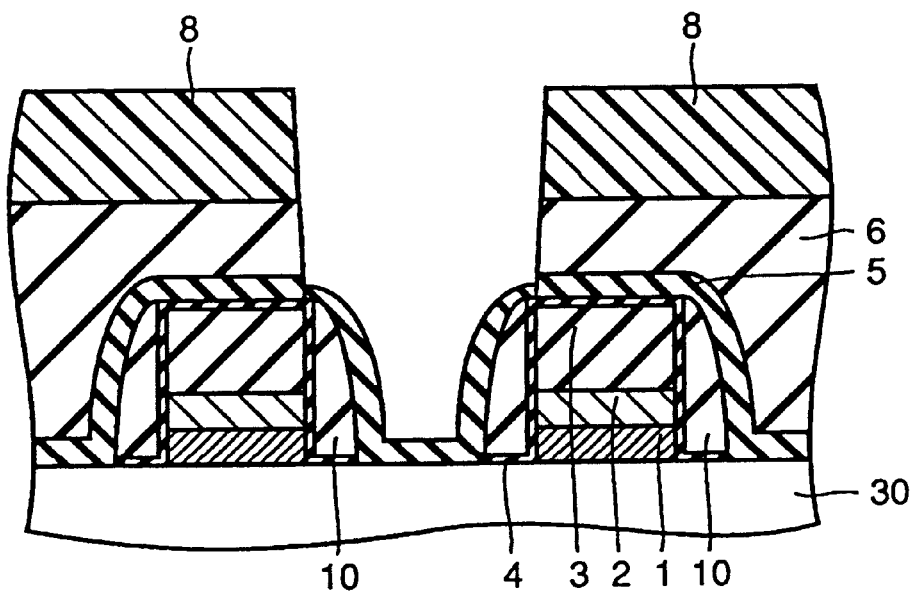

Specifically, referring to FIGS. 7 and 8, interlayer insulating film 6 is etched using resist mask 8. Etching is stopped at the surface of silicon nitride stopper layer 5.

Figure 9:
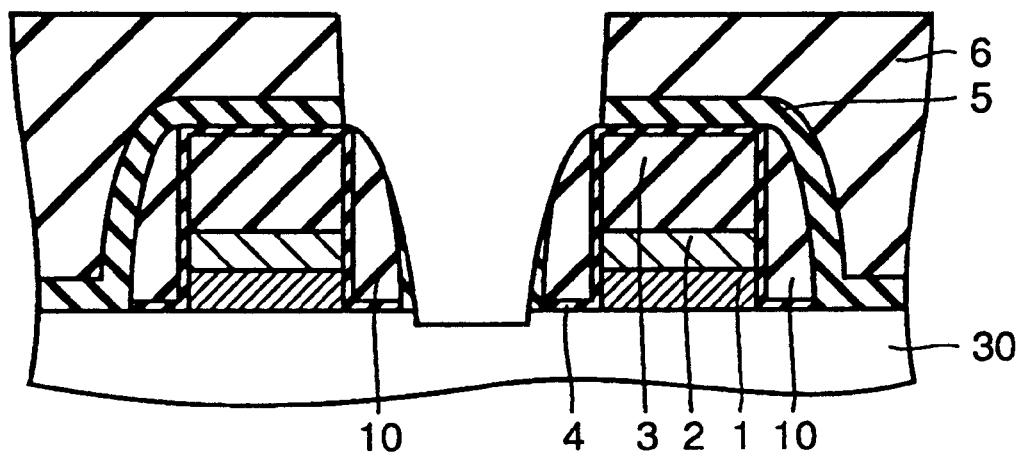

Referring to FIGS. 8 and 9, silicon nitride film serving as a stopper layer 5, is etched to open a hole for a prescribed time period sufficient to ensure that no residue of the silicon nitride film is left at the bottom of the hole. According to the third embodiment, as silicon oxide sidewall spacer 10 is provided, a sufficient breakdown voltage is guaranteed between gate interconnections 1, 2 and the subsequently formed conductive interconnection.

It should be understood that, although the first, second and third embodiments above are described as applied to form a bit line contact in a memory cell portion, this invention is not limited thereto. The present invention is also applicable to the formation of a storage node contact, and the similar effects can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
   forming on a semiconductor substrate a first interconnection pattern and a second interconnection pattern adjacent to each other, each with a first oxide film formed thereon;
   forming a second oxide film on said semiconductor substrate to cover sidewalls of said first and second interconnection patterns;
   forming a silicon nitride film as an etching stopper to cover said first and second interconnection patterns with said first and second oxide films interposed therebetween;
   forming an interlayer insulating film on said semiconductor substrate to cover said silicon nitride film;
   etching, using a resist pattern, a portion of said interlayer insulating film located between said first interconnection pattern and said second interconnection pattern until a surface of said silicon nitride film is exposed, to form a contact hole;
   removing said resist pattern; and
   dry-etching in a self-aligned manner a bottom of said contact hole employing mixed gas plasma containing $CH_2F_2$ and $O_2$ with a mixture ratio of said $O_2$ to said $CH_2F_2$ between 25 and 40%, to expose a surface of said semiconductor substrate.

2. The method of manufacturing a semiconductor device according to claim 1, wherein said etching is conducted to form a bit line contact of a memory cell portion.

3. The method of manufacturing a semiconductor device according to claim 1, wherein said etching is conducted to form a storage node contact of a memory cell portion.

4. The method of manufacturing a semiconductor device according to claim 1, wherein an opening formed in said resist pattern for formation of said contact hole has a diameter of 0.1 to 0.5 $\mu$m.

5. A method of manufacturing a semiconductor device, comprising the steps of:
   forming on a semiconductor substrate a first interconnection pattern and a second interconnection pattern adjacent to each other, each with a first oxide film formed thereon;
   forming a second oxide film on said semiconductor substrate to cover sidewalls of said first and second interconnection patterns;
   forming a silicon nitride film as an etching stopper to cover said first and second interconnection patterns with said first and second oxide films interposed therebetween;
   forming an interlayer insulating film on said semiconductor substrate to cover said silicon nitride film;
   etching, using a resist pattern, a portion of said interlayer insulating film located between said first interconnection pattern and said second interconnection pattern until a surface of said silicon nitride film is exposed, to form a contact hole;
   removing said resist pattern;
   etching said silicon nitride film at a bottom of said contact hole in a self-aligned manner to expose a surface of said second oxide film; and
   etching said second oxide film at the bottom of said contact hole in a self-aligned manner by setting etch selectivity of said first oxide film to said silicon nitride film to at most 1, to expose a surface of said semiconductor substrate.

6. The method of manufacturing a semiconductor device according to claim 5, wherein said etching is conducted to form a bit line contact of a memory cell portion.

7. The method of manufacturing a semiconductor device according to claim 5, wherein said etching is conducted to form a storage node contact of a memory cell portion.

8. A method of manufacturing a semiconductor device, comprising the steps of:
   forming on a semiconductor substrate a first interconnection pattern and a second interconnection pattern adjacent to each other, each with a first oxide film formed thereon;
   forming a second oxide film on said semiconductor substrate to cover both sidewalls of both of said first and second interconnection patterns;
   forming sidewall spacers made of a third oxide film on the both sidewalls of said first interconnection pattern and the both sidewalls of said second interconnection pattern;
   forming a silicon nitride film as an etching stopper to cover said first and second interconnection patterns with said first, second and third oxide films interposed therebetween;
   forming an interlayer insulating film on said semiconductor substrate to cover said silicon nitride film;
   etching, using a resist pattern, a portion of said interlayer insulating film located between said first interconnection pattern and said second interconnection pattern until a surface of said silicon nitride film is exposed, to form a contact hole;
   removing said resist pattern; and
   etching a bottom of said contact hole in a self-aligned manner to expose a surface of said semiconductor substrate.

9. The method of manufacturing a semiconductor device according to claim 8, wherein said etching is conducted to form a bit line contact of a memory cell portion.

10. The method of manufacturing a semiconductor device according to claim 8, wherein said etching is conducted to form a storage node contact of a memory cell portion.

* * * * *